US009159402B2

(12) United States Patent
Asthana et al.

(10) Patent No.: US 9,159,402 B2
(45) Date of Patent: Oct. 13, 2015

(54) SRAM BITCELL IMPLEMENTED IN DOUBLE GATE TECHNOLOGY

(75) Inventors: Vivek Asthana, Greater Noida (IN); Malathi Kar, Delhi (IN); Philippe Galy, La Touvet (FR); Jean Jimenez, Saint Theoffrey (FR)

(73) Assignees: STMicroelectronics International N.V., Amsterdam (NL); STMicroelectronics SA, Montrouge (FR)

( * ) Notice: Subject to any disclaimer, the term of this patent is extended or adjusted under 35 U.S.C. 154(b) by 210 days.

(21) Appl. No.: 13/539,577

(22) Filed: Jul. 2, 2012

(65) Prior Publication Data
US 2014/0003135 A1  Jan. 2, 2014

(51) Int. Cl.
G11C 11/00 (2006.01)
G11C 11/412 (2006.01)
G11C 11/419 (2006.01)

(52) U.S. Cl.
CPC ............ G11C 11/412 (2013.01); G11C 11/419 (2013.01); G11C 11/4125 (2013.01)

(58) Field of Classification Search
CPC . G11C 11/412; G11C 11/419; G11C 11/4125
USPC .................................................. 365/156, 154
See application file for complete search history.

(56) References Cited

U.S. PATENT DOCUMENTS

| 7,019,369 | B2 | 3/2006 | Sato |
| 7,177,177 | B2 | 2/2007 | Chuang et al. |
| 7,498,637 | B2 | 3/2009 | Yamaoka et al. |
| 7,710,765 | B2 | 5/2010 | Hanafi |
| 7,852,661 | B2 | 12/2010 | Liu |
| 8,072,798 | B2 * | 12/2011 | Takeyama ..................... 365/154 |
| 8,116,118 | B2 | 2/2012 | Thomas et al. |
| 2005/0276094 | A1 * | 12/2005 | Yamaoka et al. ............. 365/154 |
| 2007/0279966 | A1 * | 12/2007 | Houston ...................... 365/154 |
| 2008/0170459 | A1 * | 7/2008 | Ikeda ........................... 365/227 |
| 2011/0122681 | A1 * | 5/2011 | Yamaoka et al. ............. 365/154 |

OTHER PUBLICATIONS

Masanao Yamaoka, et al: "Low Power SRAM Menu for SOC Application Using Yin-Yang-Feedback Memory Cell Technology," IEEE 2004 Symposium on VLSI Circuits Digest of Technical Papers, pp. 288-291 plus cover.
Myeong-Eun Hwang, et al: "A 135mV 0.13μW Process Tolerant 6T Subthreshold DTMOS SRAM in 90nm Technology," IEEE 2008 Custom Integrated Circuits Conference (CICC), pp. 419-422.

* cited by examiner

*Primary Examiner* — Richard Elms
*Assistant Examiner* — Mohammed A Bashar
(74) *Attorney, Agent, or Firm* — Gardere Wynne Sewell LLP

(57) ABSTRACT

An SRAM bitcell includes first and second CMOS inverters connected as a latch defining a true node and a complement node. The bitcell further includes true and complement bitline nodes. A first direct connection is provided between the true bitline node and a back gate of at least a p-channel transistor, and perhaps also an n-channel transistor, in the second CMOS inverter. A second direct connection is provided between the complement bitline node and a back gate of at least a p-channel transistor, and perhaps also an n-channel transistor, in the first CMOS inverter. A first pass transistor is coupled between the true bitline node and the true node, and a second pass transistor is coupled between the complement bitline node and the complement node. Direct connections are also provided between a wordline and the back gates of each of the first and second pass transistors.

24 Claims, 8 Drawing Sheets

SRAM BITCELL IMPLEMENTED IN DOUBLE GATE TECHNOLOGY

TECHNICAL FIELD

The present invention relates to integrated memory circuits and, in particular, to a static random access memory (SRAM) integrated circuit implemented in a double gate technology such as a fully-depleted semiconductor on insulator (FDSOI) technology with back-gate connections.

BACKGROUND

Reference is made to FIG. 1 which shows a schematic diagram of a standard six transistor (6T) static random access memory (SRAM) bitcell 10. The bitcell 10 includes two cross-coupled CMOS inverters 12 and 14, each inverter including a series connected p-channel and n-channel transistor pair. The inputs and outputs of the inverters 12 and 14 are coupled to form a latch circuit having a true node 16 and a complement node 18. The bitcell 10 further includes two transfer (passgate) transistors 20 and 22 whose gate terminals are coupled with a wordline node and are controlled by the signal present at the wordline node (WL). Transistor 20 is source-drain connected between the true node 16 and a node associated with a true bitline (BLT). Transistor 22 is source-drain connected between the complement node 18 and a node associated with a complement bitline (BLC). The source terminals of the p-channel transistors in each inverter 12 and 14 are coupled to receive a high supply voltage (for example, VDD) at a high voltage node $V_H$, while the source terminals of the n-channel transistors in each inverter 12 and 14 are coupled to receive a low supply voltage (for example, GND) at a low voltage node $V_L$. The high voltage VDD at the node $V_H$ and the low voltage GND at the node $V_L$ comprise the power supply set of voltages for the cell 10.

Reference is made to FIG. 2 which shows a schematic diagram of a standard eight transistor (8T) SRAM bitcell 30 that supports decoupled read and write ports. The bitcell 30 includes two cross-coupled CMOS inverters 32 and 34, each inverter including a series connected p-channel and n-channel transistor pair. The inputs and outputs of the inverters 32 and 34 are coupled to form a latch circuit having a true node 36 and a complement node 38. The bitcell 30 further includes two transfer (passgate) transistors 40 and 42 whose gate terminals are coupled with a write wordline node and are controlled by the signal present at the write wordline node (WWL). Transistor 40 is source-drain connected between the true node 36 and a node associated with a true bitline (BLT). Transistor 42 is source-drain connected between the complement node 38 and a node associated with a complement bitline (BLC). The source terminals of the p-channel transistors in each inverter 32 and 34 are coupled to receive a high supply voltage (for example, VDD) at a high voltage node $V_H$, while the source terminals of the n-channel transistors in each inverter 32 and 34 are coupled to receive a low supply voltage (for example, GND) at a low voltage node $V_L$. The high voltage VDD at the node $V_H$ and the low voltage GND at the node $V_L$ comprise the power supply set of voltages for the cell 30. The bitcell 30 further includes an n-channel transistor 44 source-drain connected between the low voltage node $V_L$ and an intermediate node 46, and an n-channel transistor 48 connected between the intermediate node 46 and a read bitline (RBL). The gate terminal of transistor 44 is coupled to the complement node 38. The gate terminal of transistor 48 is coupled to a read wordline node and is controlled by the signal present at the read wordline node (RWL).

Reference is made to FIG. 3 which shows a schematic diagram of a standard ten transistor (10T) SRAM bitcell 50 that supports decoupled read and write ports. The bitcell 50 includes two cross-coupled CMOS inverters 52 and 54, each inverter including a series connected p-channel and n-channel transistor pair. The inputs and outputs of the inverters 52 and 54 are coupled to form a latch circuit having a true node 56 and a complement node 58. The bitcell 50 further includes two transfer (passgate) transistors 60 and 62 whose gate terminals are coupled with a write wordline node and are controlled by the signal present at the write wordline node (WWL). Transistor 60 is source-drain connected between the true node 56 and a node associated with a true bitline (BLT). Transistor 62 is source-drain connected between the complement node 58 and a node associated with a complement bitline (BLC). The source terminals of the p-channel transistors in each inverter 52 and 54 are coupled to receive a high supply voltage (for example, VDD) at a high voltage node $V_H$, while the source terminals of the n-channel transistors in each inverter 52 and 54 are coupled to receive a low supply voltage (for example, GND) at a low voltage node $V_L$. The high voltage VDD at the node $V_H$ and the low voltage GND at the node $V_L$ comprise the power supply set of voltages for the cell 50. The bitcell 50 further includes an n-channel transistor 64 source-drain connected between the low voltage node $V_L$ and an intermediate node 66, and an n-channel transistor 68 connected between the intermediate node 66 and a complement read bitline (RBLC). The gate terminal of transistor 64 is coupled to the complement node 58. The gate terminal of transistor 68 is coupled to a read wordline node and is controlled by the signal present at the read wordline node (RWL). The bitcell 50 further includes an n-channel transistor 74 source-drain connected between the low voltage node $V_L$ and an intermediate node 76, and an n-channel transistor 78 connected between the intermediate node 76 and a true read bitline (RBLT). The gate terminal of transistor 74 is coupled to the true node 56. The gate terminal of transistor 78 is coupled to a read wordline node and is controlled by the signal present at the read wordline node (RWL).

In an integrated circuit including the SRAM bitcells 10, 30 or 50, for example in an SRAM device or circuit which embeds an SRAM array, the power supply set of voltages may be received at pins of the integrated circuit, or may instead be generated on chip by a voltage regulator circuit which receives some other set of voltages from the pins of the chip. The power supply set of voltages at the nodes $V_H$ and $V_L$ are conventionally applied to the SRAM bitcell 10, 30, 50 at all times that the cell/integrated circuit is operational. It will be recognized that separate low voltage values at node $V_L$ may be provided for the sources of the n-channel MOS transistors in the inverters while separate high voltage values at node $V_H$ may be provided for the sources of the p-channel MOS transistors in the inverters.

To form an SRAM device or embedded SRAM array, a plurality of the bitcells 10, 30 or 50 are arranged in a matrix configuration to form a plurality of rows and columns. Row address decoder and column address decoder circuitry known in the art is provided and coupled to the rows and columns, respectively, of the memory matrix. The connection to the rows is made through the word lines, and the connection to the columns is made through column selection circuits coupled to the bit lines. Sense amplifier (read) circuitry, write drive circuitry and input/output circuitry is also coupled to the bit lines. The configuration of such an SRAM is well known to those skilled in the art.

There is a need in the art to improve the write time, write margin and read speed of the SRAM bitcells 10, 30, 50 operating in an SRAM device.

SUMMARY

In an embodiment, a static random access memory (SRAM) bitcell circuit comprises: a first CMOS inverter having a first input and a first output and formed by a first p-channel transistor and a first n-channel transistor, and a second CMOS inverter having a second input and a second output and formed by a second p-channel transistor and a second n-channel transistor, wherein the first output is coupled to the second input at a true node and wherein the second output is coupled to the first input at a complement node. A first pass transistor is coupled between a true bitline node and the true node, and a second pass transistor is coupled between a complement bitline node and the complement node. A first direct connection is provided between the true bitline node and a back gate of the second p-channel transistor in the second CMOS inverter. A second direct connection is provided between the complement bitline node and a back gate of the first p-channel transistor in the first CMOS inverter.

The embodiment may further provide the first direct connection between the true bitline node and a back gate of the second n-channel transistor in the second CMOS inverter. The embodiment may further provide the second direct connection between the complement bitline node and a back gate of the first n-channel transistor in the first CMOS inverter.

The embodiment may further include a third direct connection provided between a wordline and a back gate of the first pass transistor, and a fourth direct connection provided between the wordline and a back gate of the second pass transistor.

In an embodiment, a method for operating a static random access memory (SRAM) bitcell comprises: applying a potential present on a true bitline to a back gate of each of a first p-channel transistor and a first n-channel transistor forming a first CMOS inverter having an input connected to a true node of the SRAM bitcell; and applying a potential present on a complement bitline to a back gate of each of a second p-channel transistor and a second n-channel transistor forming a second CMOS inverter having an input connected to a complement node of the SRAM bitcell.

In an embodiment, a static random access memory (SRAM) bitcell circuit comprises: a true bitline node; a complement bitline node; a first CMOS inverter including a first p-channel transistor and a first n-channel transistor; a second CMOS inverter including a second p-channel transistor and a second n-channel transistor; a first direct connection of the complement bitline node to a back gate of at least one of the first p-channel transistor and first n-channel transistor; and a second direct connection of the true bitline node to a back gate of at least one of the second p-channel transistor and second n-channel transistor.

In an embodiment, applying a potential present on a true bitline to a back gate of at least one of a first p-channel transistor and a first n-channel transistor within a first CMOS inverter having an input connected to a true node of the SRAM bitcell; and applying a potential present on a complement bitline to a back gate of at least one of a second p-channel transistor and a second n-channel transistor within a second CMOS inverter having an input connected to a complement node of the SRAM bitcell.

BRIEF DESCRIPTION OF THE DRAWINGS

For a better understanding of the embodiments, reference will now be made by way of example only to the accompanying figures in which.

DETAILED DESCRIPTION OF THE DRAWINGS

Figure 4:
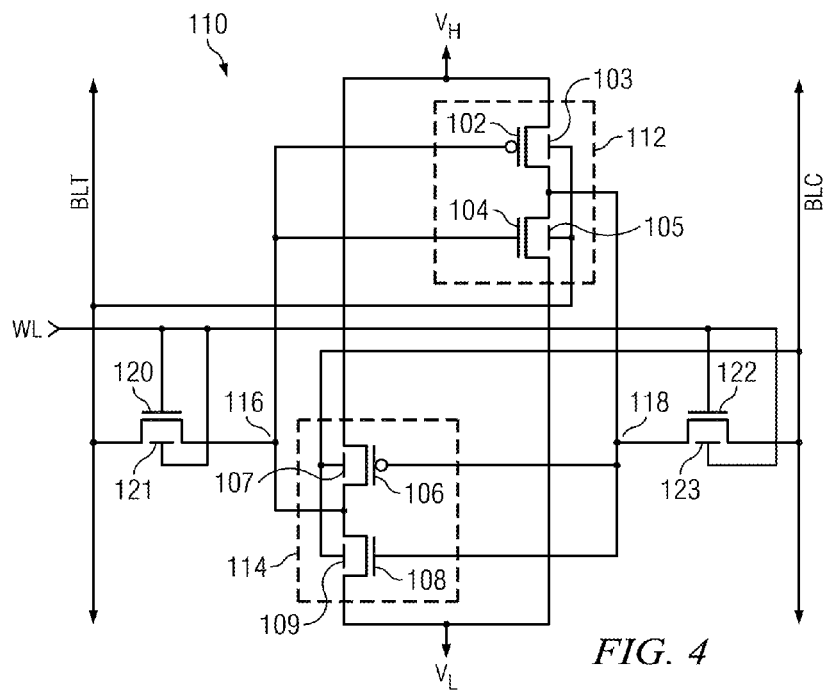
FIG. 4 is a schematic diagram of a six transistor SRAM bitcell in accordance with an embodiment.

Reference is now made to FIG. 4 which shows a schematic diagram of a six transistor SRAM bitcell 110 in accordance with an embodiment. The bitcell 110 includes two cross-coupled CMOS inverters 112 and 114, each inverter including a series connected p-channel and n-channel transistor pair. The inputs and outputs of the inverters 112 and 114 are coupled to form a latch circuit having a true node 116 and a complement node 118. The bitcell 110 further includes two transfer (pass-gate) transistors 120 and 122 whose gate terminals are coupled with a wordline node and are controlled by the signal present at the wordline node (WL). Transistor 120 is source-drain connected between the true node 116 and a node associated with a true bitline (BLT). Transistor 122 is source-drain connected between the complement node 118 and a node associated with a complement bitline (BLC). The source terminals of the p-channel transistors in each inverter 112 and 114 are coupled to receive a high supply voltage (for example, VDD) at a high voltage node $V_H$, while the source terminals of the n-channel transistors in each inverter 112 and 114 are coupled to receive a low supply voltage (for example, GND) at a low voltage node $V_L$. The high voltage VDD at the node $V_H$ and the low voltage GND at the node $V_L$ comprise the power supply set of voltages for the bitcell 110.

The pass transistor 120 has a back gate terminal 121 directly connected to the wordline at the front gate of transistor 120. Likewise, the pass transistor 122 has a back gate terminal 123 directly connected to the wordline at the front gate of transistor 122. Thus, for transistors 120 and 122, the back gate terminal is directly connected to the front gate terminal such that a potential present on the wordline is applied to the back gate terminals of transistors 120 and 122.

The CMOS inverter 112 is formed of a p-channel transistor 102 and an n-channel transistor 104 whose source-drain paths are connected in series between the high voltage node $V_H$ and the low voltage node $V_L$. The p-channel transistor 102 has a back gate terminal 103 directly connected to the true bitline (BLT). Likewise, the n-channel transistor 104 has a back gate terminal 105 directly connected to the true bitline (BLT). This circuitry permits a potential present on the true bitline (BLT) to be applied to the back gate terminals of transistors 102 and 104.

The CMOS inverter 114 is formed of a p-channel transistor 106 and an n-channel transistor 108 whose source-drain paths are connected in series between the high voltage node $V_H$ and the low voltage node $V_L$. The p-channel transistor 106 has a back gate terminal 107 directly connected to the complement bitline (BLC). Likewise, the n-channel transistor 108 has a back gate terminal 109 directly connected to the complement bitline (BLC). This circuitry permits a potential present on the complement bitline (BLC) to be applied to the back gate terminals of transistors 106 and 108.

Figure 5A:
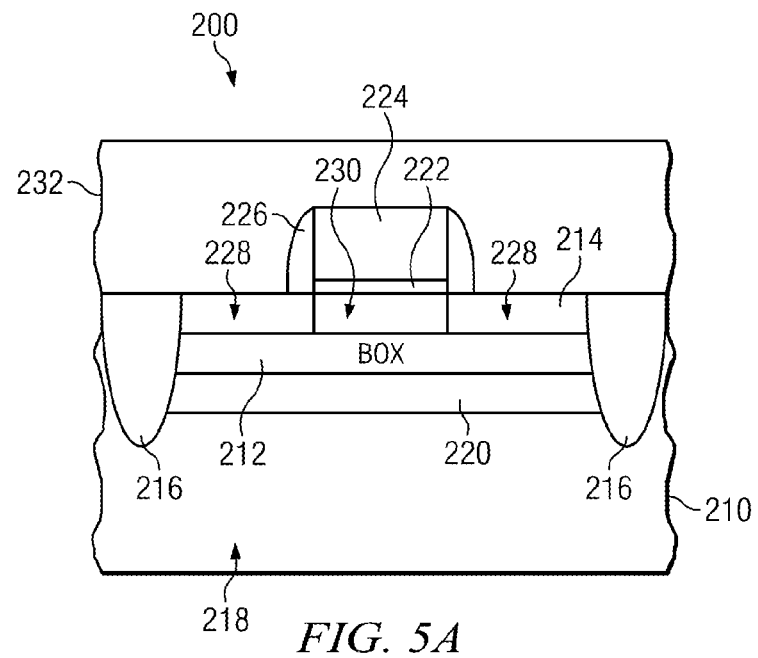
FIGS. 5A and 5B illustrate cross-sections of a transistor implemented in fully-depleted semiconductor on insulator (FDSOI) technology.
Figure 5B:
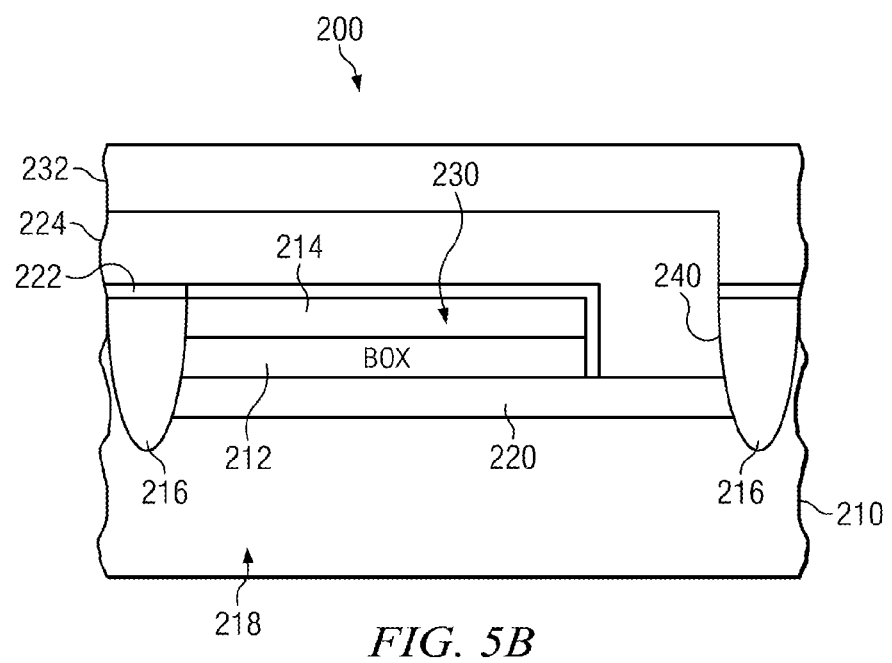

Reference is now made to FIGS. 5A and 5B which illustrate cross-sections of a transistor 200 implemented in fully-depleted semiconductor on insulator (FDSOI) technology. FIG. 5A is a cross-section taken along the gate length, and FIG. 5B is a cross-section taken along the gate width. The illustrations in FIGS. 5A and 5B are generic as to transistor conductivity type, it being understood by those skilled in the art that the illustrated transistor could be implemented with appropriate dopant selection to form either an nMOS or pMOS transistor.

A SOI substrate comprises a semiconductor substrate layer 210, and overlying buried oxide (for example, $SiO_2$) layer 212, and an overlying silicon layer 214. The SOI substrate has been penetrated by shallow trench isolation (STI) structures 216, for example, formed of $SiO_2$, to isolate the overlying silicon layer 214 and provide a region 218 for each device. The region 218 may comprise a well structure formed by or in the semiconductor substrate layer 210 and appropriately biased. An upper portion of the substrate layer 210 in the region 218 is more heavily doped to provide a back gate layer 220 under the buried oxide layer 212. A front gate stack is formed over the SOI substrate by a gate oxide layer 222, polysilicon/metal gate material 224 and sidewall spacers 226. Source/drain regions 228 are formed in the silicon layer 214 on either side of the channel region 230. A pre-metal dielectric layer 232 covers the transistor 200.

With specific reference to FIG. 5B, electrical contact between the front gate of the transistor 200 and the back gate of the transistor 200 is provided by forming an opening 240 which extends through the silicon layer 214 and the buried oxide layer 212 to reach the back gate layer 220. The gate oxide layer 222 extends into the opening 240 and coats the walls of the opening 240 (at least on the silicon layer 214 and the buried oxide layer 212 side of the opening, with the STI structure 216 providing insulation on the other side of the opening). The polysilicon/metal gate material 224 of the front gate stack extends into and fills the opening 240 so as to make electrical contact with the back gate layer 220.

The transistor 200 implemented in fully-depleted semiconductor on insulator (FDSOI) technology as shown in FIGS. 5A and 5B may be used in fabricating the pass transistors 120 and 122 of FIG. 4. The back gate layer 220 forms the back gate terminals 121 or 123 and the polysilicon/metal gate material 224 filling the opening 240 makes the direct connection between the front and back gates of the transistor.

Figure 6A:
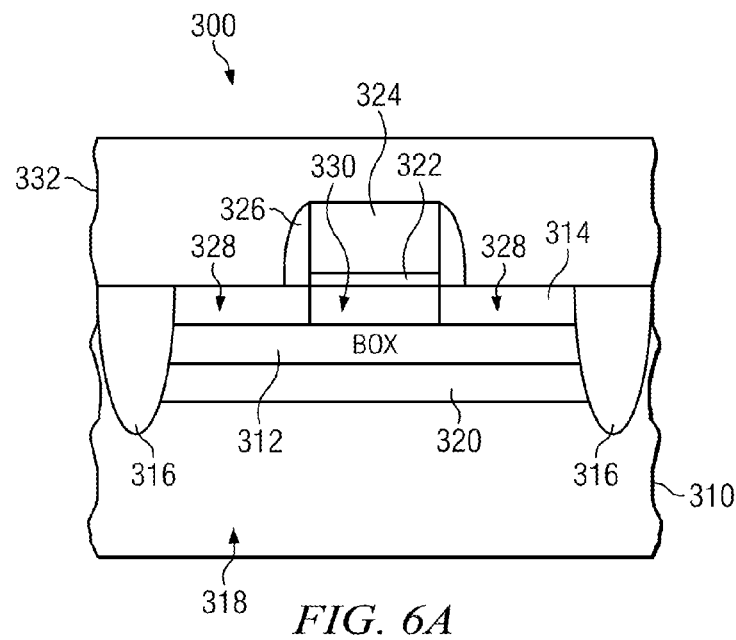
FIGS. 6A and 6B illustrate cross-sections of a transistor implemented in FDSOI technology.
Figure 6B:
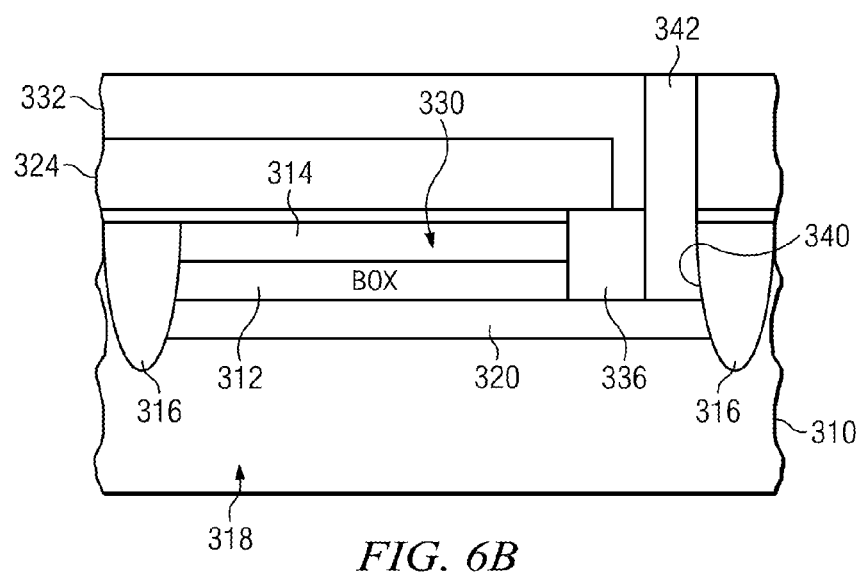

Reference is now made to FIGS. 6A and 6B which illustrate cross-sections of a transistor 300 implemented in fully-depleted semiconductor on insulator (FDSOI) technology. FIG. 6A is a cross-section taken along the gate length, and FIG. 6B is a cross-section taken along the gate width. The illustrations in FIGS. 6A and 6B are generic as to transistor conductivity type, it being understood by those skilled in the art that the illustrated transistor could be implemented with appropriate dopant selection to form either an nMOS or pMOS transistor.

An SOI substrate comprises a semiconductor substrate layer 310, and overlying buried oxide (for example, $SiO_2$) layer 312, and an overlying silicon layer 314. The SOI substrate has been penetrated by shallow trench isolation (STI) structures 316, for example, formed of $SiO_2$, to isolate the overlying silicon layer 314 and provide a region 318 for each device. The region 318 may comprise a well structure formed by or in the semiconductor substrate layer 310 and appropriately biased. An upper portion of the substrate layer 310 in the region 318 is more heavily doped to provide a back gate layer 320 under the buried oxide layer 312. A front gate stack is formed over the SOI substrate by a gate oxide layer 322, polysilicon/metal gate material 324 and sidewall spacers 326. Source/drain regions 328 are formed in the silicon layer 314 on either side of the channel region 330. A pre-metal dielectric layer 332 covers the transistor 300.

With specific reference to FIG. 6B, an isolation structure 336 is formed in the SOI substrate in the region between the shallow trench isolation (STI) structure 316 and the channel region 330. This isolation structure 336 extends in place of the silicon layer 314 and the buried oxide layer 312 (which, in an implementation, have been removed in an area adjacent the structure 316 to provide an opening that is filled with isolation material forming the isolation structure 336). An independent electrical contact to the back gate of the transistor 300 is provided by forming an opening 340 which extends through the pre-metal dielectric layer 332, gate oxide layer 322 (if not removed to form the isolation structure 336) and the isolation structure 336 to reach the back gate layer 320. The opening 340 is then filled with a metal material to form a back gate contact 342.

The transistor 300 implemented in fully-depleted semiconductor on insulator (FDSOI) technology as shown in FIGS. 6A and 6B may be used in fabricating the inverter transistors 102, 104, 106 and 108 of FIG. 4. The back gate layer 320 forms the back gate terminals 105, 106, 107 or 109. Metallization lines (not shown in FIG. 5B) overlying the pre-metal dielectric layer 332 would be provided to directly connect the back gate 320 to the bit lines of the bit cell 110 through the independent back gate contact 342.

Figure 7:
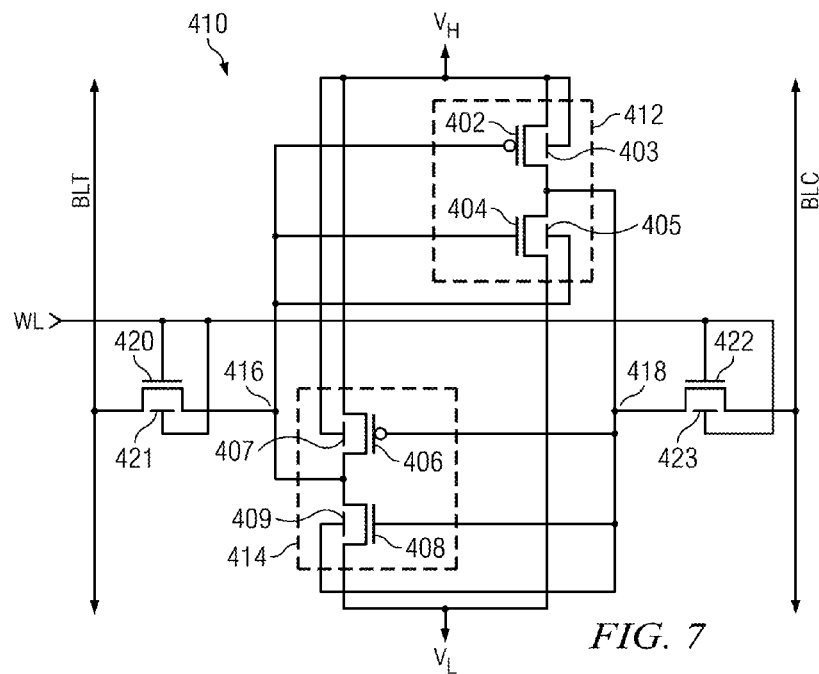
FIG. 7 is a schematic diagram of a six transistor SRAM bitcell in accordance with an embodiment.

Reference is now made to FIG. 7 which shows a schematic diagram of a six transistor SRAM bitcell 410 in accordance with an embodiment. The bitcell 410 includes two cross-coupled CMOS inverters 412 and 414, each inverter including a series connected p-channel and n-channel transistor pair. The inputs and outputs of the inverters 412 and 414 are coupled to form a latch circuit having a true node 416 and a complement node 418. The bitcell 410 further includes two transfer (passgate) transistors 420 and 422 whose gate terminals are coupled with a wordline node and are controlled by the signal present at the wordline node (WL). Transistor 420 is source-drain connected between the true node 416 and a node associated with a true bitline (BLT). Transistor 422 is source-drain connected between the complement node 418 and a node associated with a complement bitline (BLC). The source terminals of the p-channel transistors in each inverter 412 and 414 are coupled to receive a high supply voltage (for example, VDD) at a high voltage node $V_H$, while the source terminals of the n-channel transistors in each inverter 412 and 414 are coupled to receive a low supply voltage (for example, GND) at a low voltage node $V_L$. The high voltage VDD at the node $V_H$ and the low voltage GND at the node $V_L$ comprise the power supply set of voltages for the bitcell 410.

The pass transistor 420 has a back gate terminal 421 directly connected to the wordline at the front gate of transistor 420. Likewise, the pass transistor 422 has a back gate terminal 423 directly connected to the wordline at the front gate of transistor 422. Thus, for transistors 420 and 422, the back gate terminal is directly connected to the front gate terminal such that a potential present on the wordline is applied to the back gate terminals of transistors 420 and 422.

The CMOS inverter 412 is formed of a p-channel transistor 402 and an n-channel transistor 404 whose source-drain paths are connected in series between the high voltage node $V_H$ and the low voltage node $V_L$. The p-channel transistor 402 has a back gate terminal 403 directly connected to the high voltage node $V_H$. The n-channel transistor 404 has a back gate terminal 405 directly connected to the front gate of transistor 404 at true node 416. This circuitry permits a potential present on the high voltage node $V_H$ to be applied to the back gate terminal of transistor 402, and a potential present on the true node 416 to be applied to the back gate terminal of transistor 404.

The CMOS inverter 414 is formed of a p-channel transistor 406 and an n-channel transistor 408 whose source-drain paths are connected in series between the high voltage node $V_H$ and the low voltage node $V_L$. The p-channel transistor 406 has a back gate terminal 407 directly connected to the high voltage node $V_H$. The n-channel transistor 408 has a back gate terminal 409 directly connected to the front gate of transistor 408 at complement node 418. This circuitry permits a potential present on the high voltage node $V_H$ to be applied to the back gate terminal of transistor 406, and a potential present on the complement node 418 to be applied to the back gate terminal of transistor 408.

The transistor 200 implemented in fully-depleted semiconductor on insulator (FDSOI) technology as shown in FIGS. 5A and 5B may be used in fabricating the pass transistors 420 and 422 as well as the n-channel transistors 404 and 408 of FIG. 7. The back gate layer 220 forms the back gate terminals 421, 423, 405 or 409 and the polysilicon/metal gate material 224 filling the opening 240 makes the direct connection between the front and back gates of the transistor.

The transistor 300 implemented in fully-depleted semiconductor on insulator (FDSOI) technology as shown in FIGS. 6A and 6B may be used in fabricating the inverter transistors 402 and 406 of FIG. 7. The back gate layer 320 forms the back gate terminals 405 or 407. Metallization lines (not shown in FIG. 5B) overlying the pre-metal dielectric layer 332 would be provided to directly connect the back gate 320 to the high voltage node $V_H$ through the independent back gate contact 342.

Figure 8:
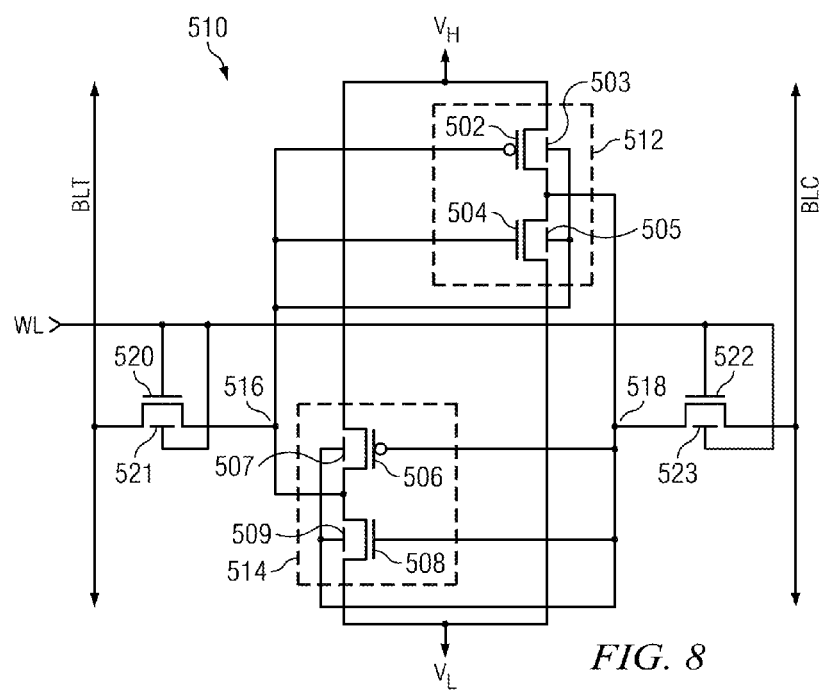
FIG. 8 is a schematic diagram of a six transistor SRAM bitcell in accordance with an embodiment.

Reference is now made to FIG. 8 which shows a schematic diagram of a six transistor SRAM bitcell 510 in accordance with an embodiment. The bitcell 510 includes two cross-coupled CMOS inverters 512 and 514, each inverter including a series connected p-channel and n-channel transistor pair. The inputs and outputs of the inverters 512 and 514 are coupled to form a latch circuit having a true node 516 and a complement node 518. The bitcell 510 further includes two transfer (passgate) transistors 520 and 522 whose gate terminals are coupled with a wordline node and are controlled by the signal present at the wordline node (WL). Transistor 520 is source-drain connected between the true node 516 and a node associated with a true bitline (BLT). Transistor 522 is source-drain connected between the complement node 518 and a node associated with a complement bitline (BLC). The source terminals of the p-channel transistors in each inverter 512 and 514 are coupled to receive a high supply voltage (for example, VDD) at a high voltage node $V_H$, while the source terminals of the n-channel transistors in each inverter 512 and 514 are coupled to receive a low supply voltage (for example, GND) at a low voltage node $V_L$. The high voltage VDD at the node $V_H$ and the low voltage GND at the node $V_L$ comprise the power supply set of voltages for the bitcell 510.

The pass transistor 520 has a back gate terminal 521 directly connected to the wordline at the front gate of transistor 520. Likewise, the pass transistor 522 has a back gate terminal 523 directly connected to the wordline at the front gate of transistor 522. Thus, for transistors 520 and 522, the back gate terminal is directly connected to the front gate terminal such that a potential present on the wordline is applied to the back gate terminals of transistors 520 and 522.

The CMOS inverter 512 is formed of a p-channel transistor 502 and an n-channel transistor 504 whose source-drain paths are connected in series between the high voltage node $V_H$ and the low voltage node $V_L$. The p-channel transistor 502 has a back gate terminal 503 directly connected to the true node 516 at the front gate of transistor 502. Likewise, the n-channel transistor 504 has a back gate terminal 505 directly connected to the true node 516 at the front gate of transistor 504. This circuitry permits a potential present on the true node 516 to be applied to the back gate terminals of transistors 502 and 504.

The CMOS inverter 514 is formed of a p-channel transistor 506 and an n-channel transistor 508 whose source-drain paths are connected in series between the high voltage node $V_H$ and the low voltage node $V_L$. The p-channel transistor 506 has a back gate terminal 507 directly connected to the complement node 518 at the front gate of transistor 506. Likewise, the n-channel transistor 508 has a back gate terminal 509 directly connected to the complement node 518 at the front gate of transistor 508. This circuitry permits a potential present on the complement node 518 to be applied to the back gate terminals of transistors 506 and 508.

The transistor 200 implemented in fully-depleted semiconductor on insulator (FDSOI) technology as shown in FIGS. 5A and 5B may be used in fabricating the pass transistors 520 and 522 as well as the inverter transistors 502, 504, 506 and 508 of FIG. 8. The back gate layer 220 forms the back gate terminals 503, 505, 507, 509, 521, or 523 and the polysilicon/metal gate material 224 filling the opening 240 makes the direct connection between the front and back gates of the transistor.

Figure 9:
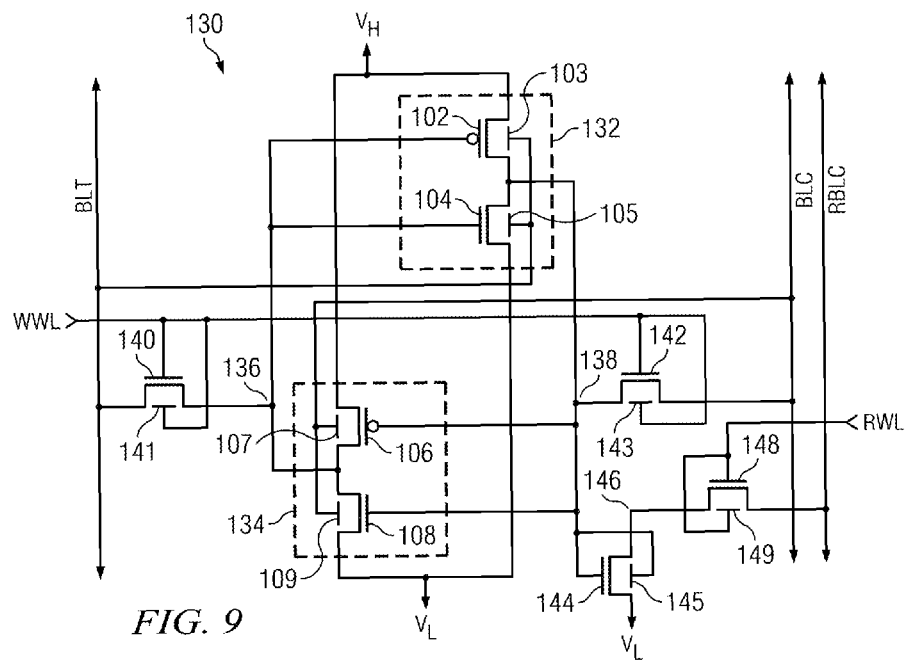
FIG. 9 is a schematic diagram of an eight transistor SRAM bitcell in accordance with an embodiment.

Reference is made to FIG. 9 which shows a schematic diagram of an eight transistor (8T) SRAM bitcell 130 in accordance with an embodiment that supports decoupled read and write ports. The bitcell 130 includes two cross-coupled CMOS inverters 132 and 134, each inverter including a series connected p-channel and n-channel transistor pair. The inputs and outputs of the inverters 132 and 134 are coupled to form a latch circuit having a true node 136 and a complement node 138. The bitcell 130 further includes two transfer (passgate) transistors 140 and 142 whose gate terminals are coupled with a write wordline node and are controlled by the signal present at the wordline node (WWL). Transistor 140 is source-drain connected between the true node 36 and a node associated with a true bitline (BLT). Transistor 142 is source-drain connected between the complement node 138 and a node associated with a complement bitline (BLC). The source terminals of the p-channel transistors in each inverter 132 and 134 are coupled to receive a high supply voltage (for example, VDD) at a high voltage node $V_H$, while the source terminals of the n-channel transistors in each inverter 132 and 134 are coupled to receive a low supply voltage (for example, GND)

at a low voltage node $V_L$. The high voltage VDD at the node $V_H$ and the low voltage GND at the node $V_L$ comprise the power supply set of voltages for the cell 130. The bitcell 130 further includes an n-channel transistor 144 source-drain connected between the low voltage node $V_L$ and an intermediate node 146, and an n-channel transistor 148 connected between the intermediate node 146 and a read bitline (RBL). The gate terminal of transistor 144 is coupled to the complement node 138. The gate terminal of transistor 148 is coupled to a read wordline node and is controlled by the signal present at the read wordline node (RWL).

The pass transistor 140 has a back gate terminal 141 directly connected to the write wordline at the front gate of transistor 140. Likewise, the pass transistor 142 has a back gate terminal 143 directly connected to the write wordline at the front gate of transistor 142. Thus, for transistors 140 and 142, the back gate terminal is directly connected to the front gate terminal such that a potential present on the write wordline is applied to the back gate terminals of transistors 140 and 142.

The transistor 144 has a back gate terminal 145 directly connected to the complement node 138 at the front gate of transistor 144. This circuitry permits a potential present on the complement node 138 to be applied to the back gate terminal of transistor 144.

The transistor 148 has a back gate terminal 149 directly connected to the read wordline at the front gate of transistor 148. This circuitry permits a potential present on the read word line (RWL) to be applied to the back gate terminal of transistor 148.

The CMOS inverter 132 is formed of a p-channel transistor 102 and an n-channel transistor 104 whose source-drain paths are connected in series between the high voltage node $V_H$ and the low voltage node $V_L$. The p-channel transistor 102 has a back gate terminal 103 directly connected to the true bitline (BLT). Likewise, the n-channel transistor 104 has a back gate terminal 105 directly connected to the true bitline (BLT). This circuitry permits a potential present on the true bitline (BLT) to be applied to the back gate terminals of transistors 102 and 104.

The CMOS inverter 134 is formed of a p-channel transistor 106 and an n-channel transistor 108 whose source-drain paths are connected in series between the high voltage node $V_H$ and the low voltage node $V_L$. The p-channel transistor 106 has a back gate terminal 107 directly connected to the complement bitline (BLC). Likewise, the n-channel transistor 108 has a back gate terminal 109 directly connected to the complement bitline (BLC). This circuitry permits a potential present on the complement bitline (BLC) to be applied to the back gate terminals of transistors 106 and 108.

The transistor 200 implemented in fully-depleted semiconductor on insulator (FDSOI) technology as shown in FIGS. 5A and 5B may be used in fabricating the pass transistors 140 and 142 as well as the n-channel transistors 144 and 148 of FIG. 9. The back gate layer 220 forms the back gate terminals 141, 143, 145 or 149 and the polysilicon/metal gate material 224 filling the opening 240 makes the direct connection between the front and back gates of the transistor.

The transistor 300 implemented in fully-depleted semiconductor on insulator (FDSOI) technology as shown in FIGS. 6A and 6B may be used in fabricating the inverter transistors 102, 104, 106 and 108 of FIG. 9. The back gate layer 320 forms the back gate terminals 103, 105, 107 and 109. Metallization lines (not shown in FIG. 5B) overlying the pre-metal dielectric layer 332 would be provided to directly connect the back gate 320 to the bit lines through the independent back gate contact 342.

In an alternate implementation, the eight transistor (8T) SRAM bitcell 130 of FIG. 9 may be configured with inverters 132 and 134 connected in the manner of inverters 412 and 414 illustrated in FIG. 7.

In another alternate implementation, the eight transistor (8T) SRAM bitcell 130 of FIG. 9 may be configured with inverters 132 and 134 connected in the manner of inverters 512 and 514 illustrated in FIG. 8.

Figure 10:
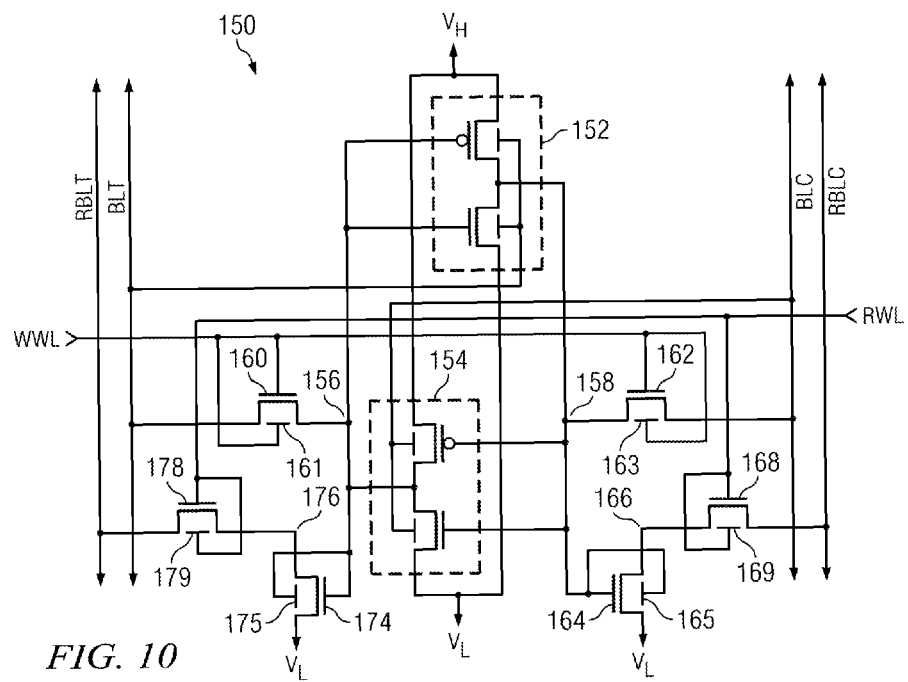
FIG. 10 is a schematic diagram of a ten transistor SRAM bitcell in accordance with an embodiment.

Reference is made to FIG. 10 which shows a schematic diagram of a ten transistor (10T) SRAM bitcell 150 in accordance with an embodiment that supports decoupled read and write ports. The bitcell 150 includes two cross-coupled CMOS inverters 152 and 154, each inverter including a series connected p-channel and n-channel transistor pair. The inputs and outputs of the inverters 152 and 154 are coupled to form a latch circuit having a true node 156 and a complement node 158. The bitcell 150 further includes two transfer (passgate) transistors 160 and 162 whose gate terminals are coupled with a write wordline node and are controlled by the signal present at the write wordline node (WWL). Transistor 160 is source-drain connected between the true node 156 and a node associated with a true bitline (BLT). Transistor 162 is source-drain connected between the complement node 158 and a node associated with a complement bitline (BLC). The source terminals of the p-channel transistors in each inverter 152 and 154 are coupled to receive a high supply voltage (for example, VDD) at a high voltage node $V_H$, while the source terminals of the n-channel transistors in each inverter 152 and 154 are coupled to receive a low supply voltage (for example, GND) at a low voltage node $V_L$. The high voltage VDD at the node $V_H$ and the low voltage GND at the node $V_L$ comprise the power supply set of voltages for the cell 150. The bitcell 150 further includes an n-channel transistor 164 source-drain connected between the low voltage node $V_L$ and an intermediate node 166, and an n-channel transistor 168 connected between the intermediate node 166 and a complement read bitline (RBLC). The gate terminal of transistor 164 is coupled to the complement node 158. The gate terminal of transistor 168 is coupled to a read wordline node and is controlled by the signal present at the read wordline node (RWL). The bitcell 150 further includes an n-channel transistor 174 source-drain connected between the low voltage node $V_L$ and an intermediate node 176, and an n-channel transistor 178 connected between the intermediate node 176 and a true read bitline (RBLT). The gate terminal of transistor 174 is coupled to the true node 156. The gate terminal of transistor 178 is coupled to a read wordline node and is controlled by the signal present at the read wordline node (RWL).

The pass transistor 160 has a back gate terminal 161 directly connected to the write wordline at the front gate of transistor 160. Likewise, the pass transistor 162 has a back gate terminal 163 directly connected to the write wordline at the front gate of transistor 162. Thus, for transistors 160 and 162, the back gate terminal is directly connected to the front gate terminal such that a potential present on the write wordline is applied to the back gate terminals of transistors 160 and 162.

The transistor 164 has a back gate terminal 165 directly connected to the complement node 158 at the front gate of transistor 164. This circuitry permits a potential present on the complement node 158 to be applied to the back gate terminal of transistor 164.

The transistor 168 has a back gate terminal 169 directly connected to the read wordline (RWL) at the front gate of transistor 168. This circuitry permits a potential present on the read wordline (RWL) to be applied to the back gate terminal of transistor 168.

The transistor 174 has a back gate terminal 175 directly connected to the true node 156 at the front gate of transistor 174. This circuitry permits a potential present on the true node 156 to be applied to the back gate terminal of transistor 174.

The transistor 178 has a back gate terminal 179 directly connected to the read wordline (RWL) at the front gate of transistor 178. This circuitry permits a potential present on the read wordline (RWL) to be applied to the back gate terminal of transistor 178.

The CMOS inverter 152 is formed of a p-channel transistor 102 and an n-channel transistor 104 whose source-drain paths are connected in series between the high voltage node $V_H$ and the low voltage node $V_L$. The p-channel transistor 102 has a back gate terminal 103 directly connected to the true bitline (BLT). Likewise, the n-channel transistor 104 has a back gate terminal 105 directly connected to the true bitline (BLT). This circuitry permits a potential present on the true bitline (BLT) to be applied to the back gate terminals of transistors 102 and 104.

The CMOS inverter 154 is formed of a p-channel transistor 106 and an n-channel transistor 108 whose source-drain paths are connected in series between the high voltage node $V_H$ and the low voltage node $V_L$. The p-channel transistor 106 has a back gate terminal 107 directly connected to the complement bitline (BLC). Likewise, the n-channel transistor 108 has a back gate terminal 109 directly connected to the complement bitline (BLC). This circuitry permits a potential present on the complement bitline (BLC) to be applied to the back gate terminals of transistors 106 and 108.

The transistor 200 implemented in fully-depleted semiconductor on insulator (FDSOI) technology as shown in FIGS. 5A and 5B may be used in fabricating the pass transistors 160 and 162 as well as the n-channel transistors 164, 168, 174 and 178 of FIG. 10. The back gate layer 220 forms the back gate terminals 161, 163, 165, 169, 175 and 179 and the polysilicon/metal gate material 224 filling the opening 240 makes the direct connection between the front and back gates of the transistor.

The transistor 300 implemented in fully-depleted semiconductor on insulator (FDSOI) technology as shown in FIGS. 6A and 6B may be used in fabricating the inverter transistors 102, 104, 106 and 108 of FIG. 10. The back gate layer 320 forms the back gate terminals 103, 105, 107 and 109. Metallization lines (not shown in FIG. 5B) overlying the pre-metal dielectric layer 332 would be provided to directly connect the back gate 320 to the bit lines through the independent back gate contact 342.

In an alternate implementation, the ten transistor (10T) SRAM bitcell 150 of FIG. 10 may be configured with inverters 152 and 154 connected in the manner of inverters 412 and 414 illustrated in FIG. 7.

In an another alternate implementation, the ten transistor (10T) SRAM bitcell 150 of FIG. 10 may be configured with inverters 152 and 154 connected in the manner of inverters 512 and 514 illustrated in FIG. 8.

Figure 11:
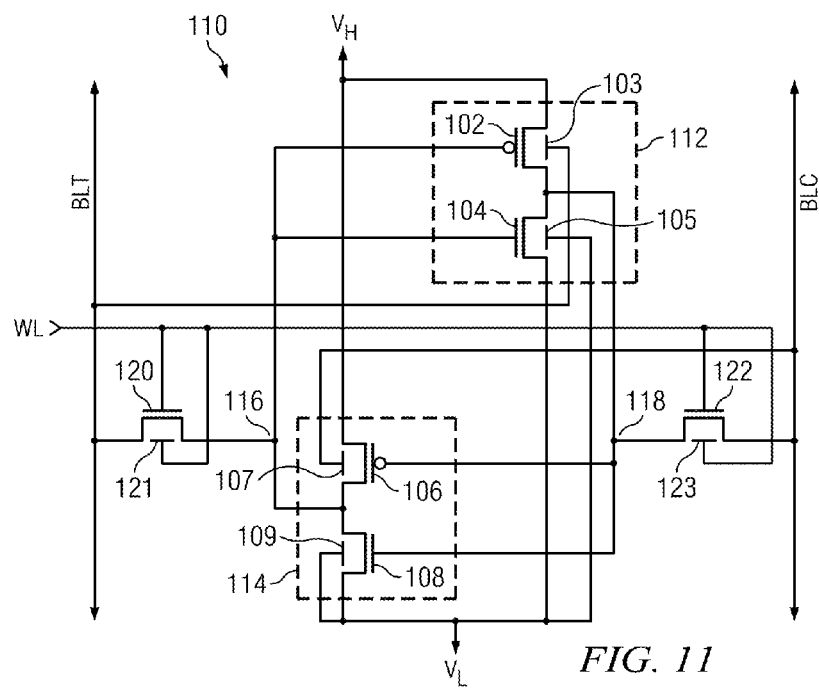
FIG. 11 is a schematic diagram of a six transistor SRAM bitcell in accordance with an embodiment.

Reference is now made to FIG. 11 which shows a schematic diagram of a six transistor SRAM bitcell 110 in accordance with an embodiment. The bitcell 110 includes two cross-coupled CMOS inverters 112 and 114, each inverter including a series connected p-channel and n-channel transistor pair. The inputs and outputs of the inverters 112 and 114 are coupled to form a latch circuit having a true node 116 and a complement node 118. The bitcell 110 further includes two transfer (passgate) transistors 120 and 122 whose gate terminals are coupled with a wordline node and are controlled by the signal present at the wordline node (WL). Transistor 120 is source-drain connected between the true node 116 and a node associated with a true bitline (BLT). Transistor 122 is source-drain connected between the complement node 118 and a node associated with a complement bitline (BLC). The source terminals of the p-channel transistors in each inverter 112 and 114 are coupled to receive a high supply voltage (for example, VDD) at a high voltage node $V_H$, while the source terminals of the n-channel transistors in each inverter 112 and 114 are coupled to receive a low supply voltage (for example, GND) at a low voltage node $V_L$. The high voltage VDD at the node $V_H$ and the low voltage GND at the node $V_L$ comprise the power supply set of voltages for the bitcell 110.

The pass transistor 120 has a back gate terminal 121 directly connected to the wordline at the front gate of transistor 120. Likewise, the pass transistor 122 has a back gate terminal 123 directly connected to the wordline at the front gate of transistor 122. Thus, for transistors 120 and 122, the back gate terminal is directly connected to the front gate terminal such that a potential present on the wordline is applied to the back gate terminals of transistors 120 and 122.

The CMOS inverter 112 is formed of a p-channel transistor 102 and an n-channel transistor 104 whose source-drain paths are connected in series between the high voltage node $V_H$ and the low voltage node $V_L$. The p-channel transistor 102 has a back gate terminal 103 directly connected to the true bitline (BLT). The n-channel transistor 104 has a back gate terminal 105 directly connected to the low voltage node $V_L$. This circuitry permits a potential present on the true bitline (BLT) to be applied to the back gate terminal of transistor 102 with a reference voltage (ground) applied to the back gate terminal of transistor 104.

The CMOS inverter 114 is formed of a p-channel transistor 106 and an n-channel transistor 108 whose source-drain paths are connected in series between the high voltage node $V_H$ and the low voltage node $V_L$. The p-channel transistor 106 has a back gate terminal 107 directly connected to the complement bitline (BLC). The n-channel transistor 108 has a back gate terminal 109 directly connected to the low voltage node $V_L$. This circuitry permits a potential present on the complement bitline (BLC) to be applied to the back gate terminal of transistor 106 with a reference voltage (ground) applied to the back gate terminal of transistor 108.

The transistor 200 implemented in fully-depleted semiconductor on insulator (FDSOI) technology as shown in FIGS. 5A and 5B may be used in fabricating the pass transistors 120 and 122 of FIG. 11. The back gate layer 220 forms the back gate terminals 121 and 123 and the polysilicon/metal gate material 224 filling the opening 240 makes the direct connection between the front and back gates of the transistor.

The transistor 300 implemented in fully-depleted semiconductor on insulator (FDSOI) technology as shown in FIGS. 6A and 6B may be used in fabricating the inverter transistors 102, 104, 106 and 108 of FIG. 11. The back gate layer 320 forms the back gate terminals 103, 105, 107 and 109. Metallization lines (not shown in FIG. 5B) overlying the pre-metal dielectric layer 332 would be provided to directly connect the back gate 320 to the bit lines or reference voltage node through the independent back gate contact 342.

Figure 12:
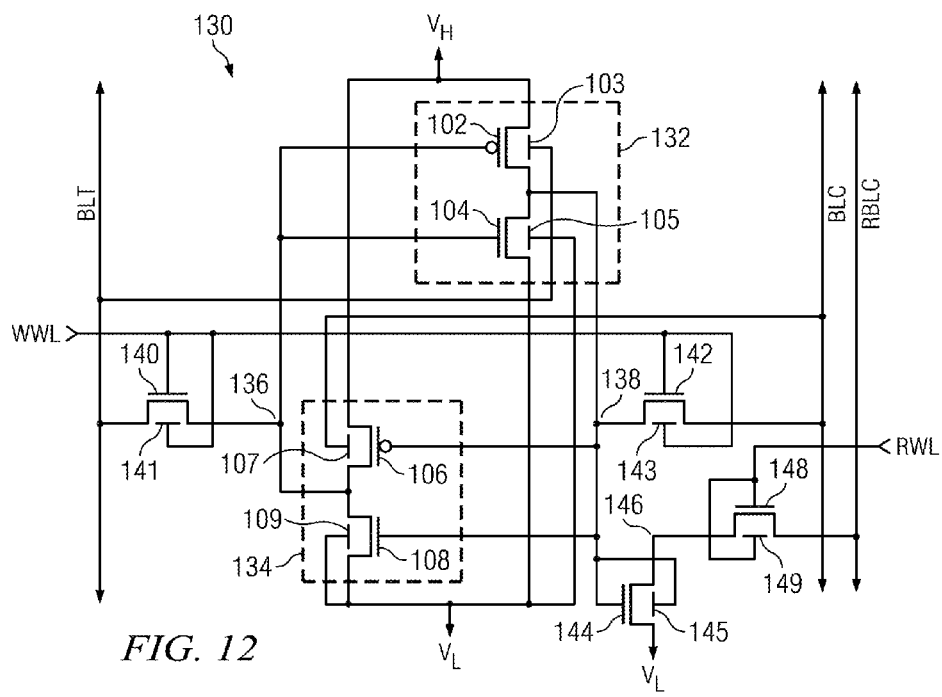
FIG. 12 is a schematic diagram of an eight transistor SRAM bitcell in accordance with an embodiment.

Reference is made to FIG. 12 which shows a schematic diagram of an eight transistor (8T) SRAM bitcell 130 in accordance with an embodiment that supports decoupled read and write ports. The bitcell 130 includes two cross-coupled CMOS inverters 132 and 134, each inverter including a series connected p-channel and n-channel transistor pair. The inputs and outputs of the inverters 132 and 134 are coupled to form a latch circuit having a true node 136 and a complement node 138. The bitcell 130 further includes two transfer (passgate) transistors 140 and 142 whose gate terminals are coupled with a write wordline node and are controlled by the signal present at the write wordline node (WWL). Transistor 140 is source-drain connected between the true node 136 and a node associated with a true bitline (BLT). Transistor 142 is source-drain connected between the complement node 138 and a node associated with a complement bitline (BLC). The source terminals of the p-channel transistors in each inverter 132 and 134 are coupled to receive a high supply voltage (for example, VDD) at a high voltage node $V_H$, while the source terminals of the n-channel transistors in each inverter 132 and 134 are coupled to receive a low supply voltage (for example, GND) at a low voltage node $V_L$. The high voltage VDD at the node $V_H$ and the low voltage GND at the node $V_L$ comprise the power supply set of voltages for the cell 130. The bitcell 130 further includes an n-channel transistor 144 source-drain connected between the low voltage node $V_L$ and an intermediate node 146, and an n-channel transistor 148 connected between the intermediate node 146 and a read bitline (RBLC). The gate terminal of transistor 144 is coupled to the complement node 138. The gate terminal of transistor 148 is coupled to a read wordline node and is controlled by the signal present at the read wordline node (RWL).

The pass transistor 140 has a back gate terminal 141 directly connected to the write wordline at the front gate of transistor 140. Likewise, the pass transistor 142 has a back gate terminal 143 directly connected to the write wordline at the front gate of transistor 142. Thus, for transistors 140 and 142, the back gate terminal is directly connected to the front gate terminal such that a potential present on the write wordline is applied to the back gate terminals of transistors 140 and 142.

The transistor 144 has a back gate terminal 145 directly connected to the complement node 138 at the front gate of transistor 144. This circuitry permits a potential present on the complement node 138 to be applied to the back gate terminal of transistor 144.

The transistor 148 has a back gate terminal 149 directly connected to the read wordline at the front gate of transistor 148. This circuitry permits a potential present on the read word line (RWL) to be applied to the back gate terminal of transistor 148.

The CMOS inverter 132 is formed of a p-channel transistor 102 and an n-channel transistor 104 whose source-drain paths are connected in series between the high voltage node $V_H$ and the low voltage node $V_L$. The p-channel transistor 102 has a back gate terminal 103 directly connected to the true bitline (BLT). The n-channel transistor 104 has a back gate terminal 105 directly connected to the low voltage node $V_L$. This circuitry permits a potential present on the true bitline (BLT) to be applied to the back gate terminal of transistor 102 while a reference voltage (ground) is applied to the back gate terminal of transistor 104.

The CMOS inverter 134 is formed of a p-channel transistor 106 and an n-channel transistor 108 whose source-drain paths are connected in series between the high voltage node $V_H$ and the low voltage node $V_L$. The p-channel transistor 106 has a back gate terminal 107 directly connected to the complement bitline (BLC). The n-channel transistor 108 has a back gate terminal 109 directly connected to the low voltage node $V_L$. This circuitry permits a potential present on the complement bitline (BLC) to be applied to the back gate terminal of transistors 106 while a reference voltage (ground) is applied to the back gate terminal of transistor 108.

The transistor 200 implemented in fully-depleted semiconductor on insulator (FDSOI) technology as shown in FIGS. 5A and 5B may be used in fabricating the pass transistors 140 and 142 as well as the n-channel transistors 144 and 148 of FIG. 12. The back gate layer 220 forms the back gate terminals 141, 143, 145 or 149 and the polysilicon/metal gate material 224 filling the opening 240 makes the direct connection between the front and back gates of the transistor.

The transistor 300 implemented in fully-depleted semiconductor on insulator (FDSOI) technology as shown in FIGS. 6A and 6B may be used in fabricating the inverter transistors 102, 104, 106 and 108 of FIG. 12. The back gate layer 320 forms the back gate terminals 103, 105, 107 and 109. Metallization lines (not shown in FIG. 5B) overlying the pre-metal dielectric layer 332 would be provided to directly connect the back gate 320 to the bit lines or reference voltage node through the independent back gate contact 342.

Figure 13:
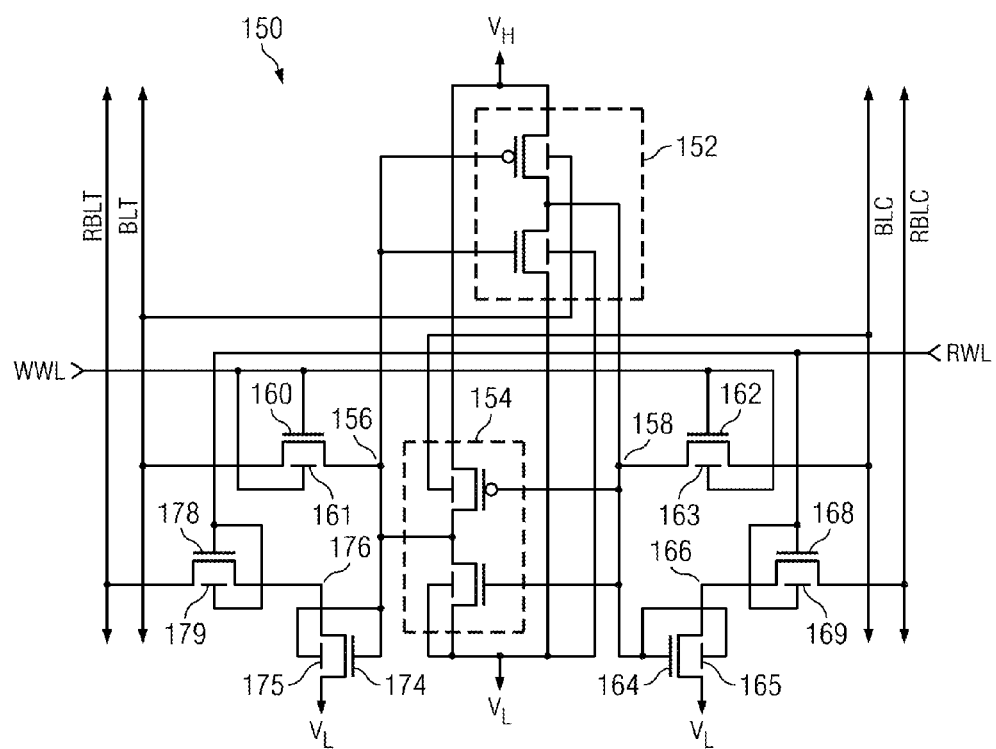
FIG. 13 is a schematic diagram of a ten transistor SRAM bitcell in accordance with an embodiment.

Reference is made to FIG. 13 which shows a schematic diagram of a ten transistor (10T) SRAM bitcell 150 in accordance with an embodiment that supports decoupled read and write ports. The bitcell 150 includes two cross-coupled CMOS inverters 152 and 154, each inverter including a series connected p-channel and n-channel transistor pair. The inputs and outputs of the inverters 152 and 154 are coupled to form a latch circuit having a true node 156 and a complement node 158. The bitcell 150 further includes two transfer (passgate) transistors 160 and 162 whose gate terminals are coupled with a write wordline node and are controlled by the signal present at the write wordline node (WWL). Transistor 160 is source-drain connected between the true node 156 and a node associated with a true bitline (BLT). Transistor 162 is source-drain connected between the complement node 158 and a node associated with a complement bitline (BLC). The source terminals of the p-channel transistors in each inverter 152 and 154 are coupled to receive a high supply voltage (for example, VDD) at a high voltage node $V_H$, while the source terminals of the n-channel transistors in each inverter 152 and 154 are coupled to receive a low supply voltage (for example, GND) at a low voltage node $V_L$. The high voltage VDD at the node $V_H$ and the low voltage GND at the node $V_L$ comprise the power supply set of voltages for the cell 150. The bitcell 150 further includes an n-channel transistor 164 source-drain connected between the low voltage node $V_L$ and an intermediate node 166, and an n-channel transistor 168 connected between the intermediate node 166 and a complement read bitline (RBLC). The gate terminal of transistor 164 is coupled to the complement node 158. The gate terminal of transistor 168 is coupled to a read wordline node and is controlled by the signal present at the read wordline node (RWL). The bitcell 150 further includes an n-channel transistor 174 source-drain connected between the low voltage node $V_L$ and an intermediate node 176, and an n-channel transistor 178 connected between the intermediate node 176 and a true read bitline (RBLT). The gate terminal of transistor 174 is coupled to the true node 156. The gate terminal of transistor 178 is coupled to a read wordline node and is controlled by the signal present at the read wordline node (RWL).

The pass transistor 160 has a back gate terminal 161 directly connected to the write wordline at the front gate of transistor 160. Likewise, the pass transistor 162 has a back gate terminal 163 directly connected to the write wordline at the front gate of transistor 162. Thus, for transistors 160 and 162, the back gate terminal is directly connected to the front gate terminal such that a potential present on the write wordline is applied to the back gate terminals of transistors 160 and 162.

The transistor 164 has a back gate terminal 165 directly connected to the complement node 158 at the front gate of transistor 164. This circuitry permits a potential present on the complement node 158 to be applied to the back gate terminal of transistor 164.

The transistor 168 has a back gate terminal 169 directly connected to the read wordline (RWL) at the front gate of transistor 168. This circuitry permits a potential present on the read wordline (RWL) to be applied to the back gate terminal of transistor 168.

The transistor 174 has a back gate terminal 175 directly connected to the true node 156 at the front gate of transistor 174. This circuitry permits a potential present on the true node 156 to be applied to the back gate terminal of transistor 174.

The transistor 178 has a back gate terminal 179 directly connected to the read wordline (RWL) at the front gate of transistor 178. This circuitry permits a potential present on the read wordline (RWL) to be applied to the back gate terminal of transistor 178.

The CMOS inverter 152 is formed of a p-channel transistor 102 and an n-channel transistor 104 whose source-drain paths are connected in series between the high voltage node $V_H$ and the low voltage node $V_L$. The p-channel transistor 102 has a back gate terminal 103 directly connected to the true bitline (BLT). The n-channel transistor 104 has a back gate terminal 105 directly connected to the low voltage node $V_L$. This circuitry permits a potential present on the true bitline (BLT) to be applied to the back gate terminal of transistor 102 while a reference voltage (ground) is applied to the back gate terminal of transistor 104.

The CMOS inverter 154 is formed of a p-channel transistor 106 and an n-channel transistor 108 whose source-drain paths are connected in series between the high voltage node $V_H$ and the low voltage node $V_L$. The p-channel transistor 106 has a back gate terminal 107 directly connected to the complement bitline (BLC). The n-channel transistor 108 has a back gate terminal 109 directly connected to the low voltage node $V_L$. This circuitry permits a potential present on the complement bitline (BLC) to be applied to the back gate terminal of transistor 106 while a reference voltage (ground) is applied to the back gate terminal of transistor 108.

The transistor 200 implemented in fully-depleted semiconductor on insulator (FDSOI) technology as shown in FIGS. 5A and 5B may be used in fabricating the pass transistors 160 and 162 as well as the n-channel transistors 164, 168, 174 and 178 of FIG. 10. The back gate layer 220 forms the back gate terminals 161, 163, 165, 169, 175 and 179 and the polysilicon/metal gate material 224 filling the opening 240 makes the direct connection between the front and back gates of the transistor.

The transistor 300 implemented in fully-depleted semiconductor on insulator (FDSOI) technology as shown in FIGS. 6A and 6B may be used in fabricating the inverter transistors 102, 104, 106 and 108 of FIG. 10. The back gate layer 320 forms the back gate terminals 103, 105, 107 and 109. Metallization lines (not shown in FIG. 5B) overlying the pre-metal dielectric layer 332 would be provided to directly connect the back gate 320 to the bit lines or reference voltage node through the independent back gate contact 342.

Figure 1:
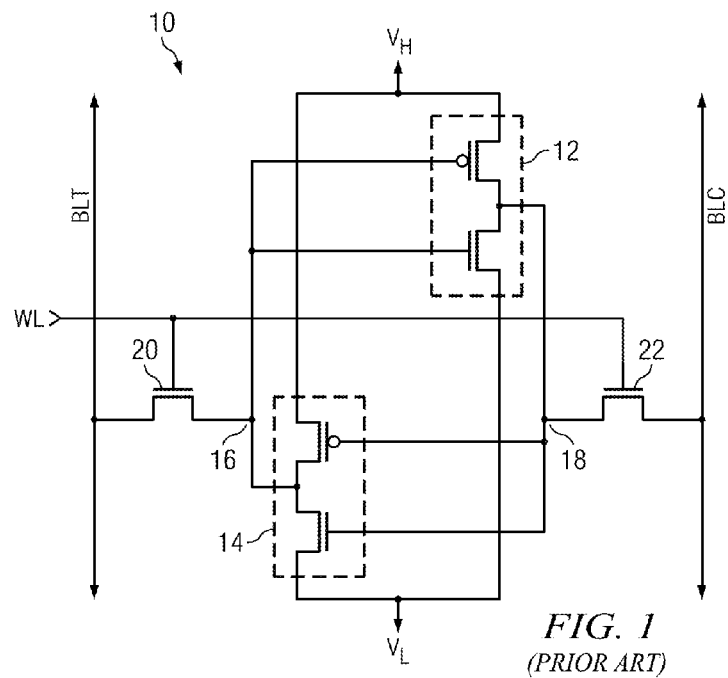
FIG. 1 is a schematic diagram of a standard six transistor static random access memory (SRAM) bitcell.
Figure 2:
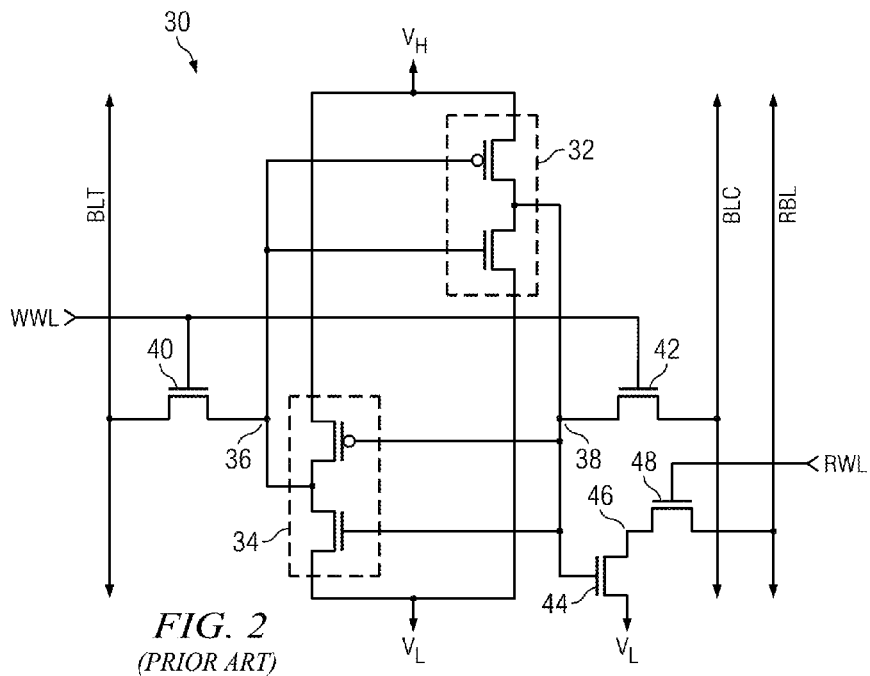
FIG. 2 is a schematic diagram of a standard eight transistor SRAM bitcell.
Figure 3:
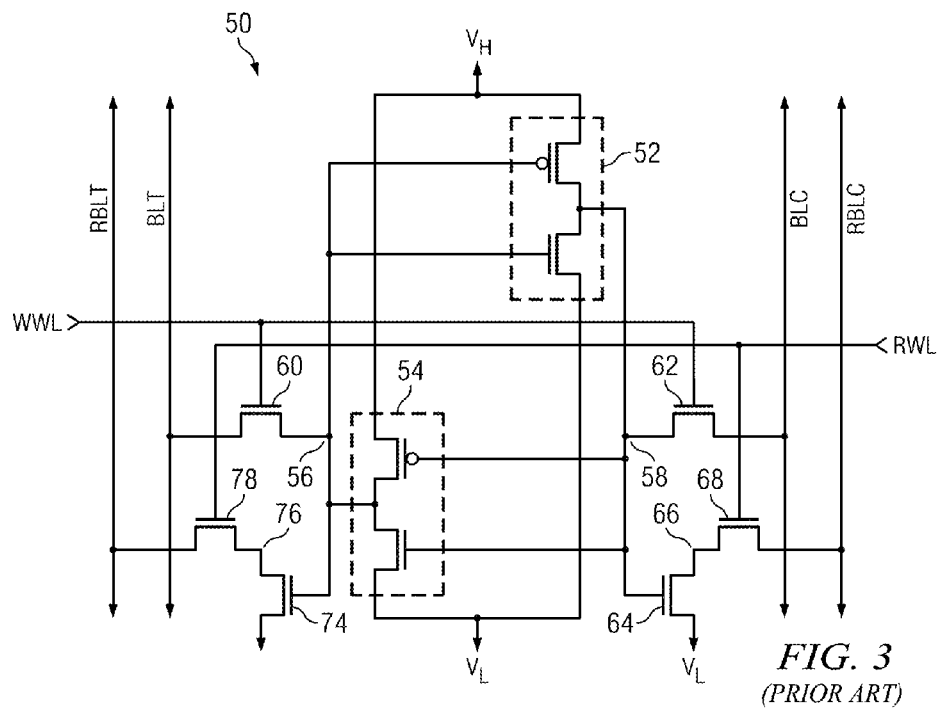
FIG. 3 is a schematic diagram of a standard ten transistor SRAM bitcell.

The bitcells described above (FIGS. 4-13) present a number of advantages over the bitcells of the prior art (FIGS. 1-3) including: improved write margin to enable ultra low voltage operation; improved read speed at all voltages; and improved write speed at low voltages.

It will be understood that the illustrations in FIGS. 5A, 5B, 6A and 6B are not necessarily drawn to scale and further that the illustrated shapes of the transistor structures have been simplified for ease of understanding. As an example only, the buried oxide layer may have a thickness in the range of 5 to 50 nm, and the overlying silicon layer may have a thickness in the range of 5 to 20 nm. The gate material for the gate stack may be partially or fully silicided polysilicon or the gate stack may be made up of a combination of metal and polysilicon. The source/drain regions may comprise raised source/drain structures as known in the art. A silicided top surface of the source/drain regions may be included to support the making of electrical contact.

Although implementation using the fully-depleted semiconductor on insulator (FDSOI) technology described above is preferred, it will be understood that the bitcells could alternatively be implemented using conventional bulk CMOS technology, including the use of FINFET technology, which supports the making of a back gate structure and connection.

The foregoing description has provided by way of exemplary and non-limiting examples a full and informative description of the exemplary embodiment of this invention. However, various modifications and adaptations may become apparent to those skilled in the relevant arts in view of the foregoing description, when read in conjunction with the accompanying drawings and the appended claims. However, all such and similar modifications of the teachings of this invention will still fall within the scope of this invention as defined in the appended claims.

What is claimed is:

1. A static random access memory (SRAM) bitcell circuit, comprising:
    a first CMOS inverter having a first input and a first output and formed by a first p-channel transistor and a first n-channel transistor;
    a second CMOS inverter having a second input and a second output and formed by a second p-channel transistor and a second n-channel transistor;
    wherein the first output is coupled to the second input at a true node;
    wherein the second output is coupled to the first input at a complement node;
    a first pass transistor coupled between a true bitline node and the true node;
    a second pass transistor coupled between a complement bitline node and the complement node;
    a first direct connection of the true bitline node to apply a true bitline potential to a back gate of the second p-channel transistor in the second CMOS inverter; and
    a second direct connection of the complement bitline node to apply a complement bitline potential to a back gate of the first p-channel transistor in the first CMOS inverter.

2. The circuit of claim 1, wherein the first direct connection further directly connects the true bitline node to a back gate of the second n-channel transistor in the second CMOS inverter, and wherein the second direct connection further directly connects the complement bitline node to a back gate of the first n-channel transistor in the first CMOS inverter.

3. The circuit of claim 1, further comprising a direct connection of a back gate of the second n-channel transistor in the second CMOS inverter and a back gate of the first n-channel transistor in the first CMOS inverter to a reference voltage supply node.

4. The circuit of claim 1, further comprising: a wordline node connected to a gate terminal of each of the first and second pass transistors; a third direct connection of the wordline node to a back gate of the first pass transistor; and a fourth direct connection of the wordline node to a back gate of the second pass transistor.

5. The circuit of claim 1, wherein the first and second pass transistors are implemented in fully-depleted semiconductor on insulator (FDSOI) technology including an SOI substrate including a buried oxide layer, a first semiconductor layer over the buried oxide layer and a second semiconductor layer under the buried oxide layer, and a front gate stack formed over the first semiconductor layer including an extension of a front gate electrode to contact the second semiconductor layer, wherein the second semiconductor layer forms the back gate.

6. The circuit of claim 1, further comprising: a read wordline node; a first read transistor coupled between a complement read bitline and an intermediate node and having a gate terminal connected to the read wordline; and a fifth direct connection of the read wordline node to a back gate of the first read transistor.

7. The circuit of claim 6, further comprising: a second read transistor coupled in series with the first read transistor between the intermediate node and a supply node, said second read transistor having a gate terminal connected to the complement node; and a sixth direct connection of the complement node to a back gate of the second read transistor.

8. The circuit of claim 7, wherein the first and second read transistors are implemented in fully-depleted semiconductor on insulator (FDSOI) technology including an SOI substrate including a buried oxide layer, a first semiconductor layer over the buried oxide layer and a second semiconductor layer under the buried oxide layer, and a front gate stack formed over the first semiconductor layer including an extension of a front gate electrode to contact the second semiconductor layer, wherein the second semiconductor layer forms the back gate.

9. The circuit of claim 6, further comprising: a third read transistor coupled between a true read bitline and another intermediate node and having a gate terminal connected to the read wordline; and a seventh direct connection of the read wordline node to a back gate of the third read transistor.

10. The circuit of claim 9, further comprising: a fourth read transistor coupled in series with the third read transistor between the another intermediate node and a supply node, said fourth read transistor having a gate terminal connected to the true node; and an eighth direct connection of the true node to a back gate of the fourth read transistor.

11. The circuit of claim 10, wherein the third and fourth read transistors are implemented in fully-depleted semiconductor on insulator (FDSOI) technology including an SOI substrate including a buried oxide layer, a first semiconductor layer over the buried oxide layer and a second semiconductor layer under the buried oxide layer, and a front gate stack formed over the first semiconductor layer including an extension of a front gate electrode to contact the second semiconductor layer, wherein the second semiconductor layer forms the back gate.

12. The circuit of claim 1, wherein the first p-channel transistor, first n-channel transistor, second p-channel transistor and second n-channel transistor are implemented in fully-depleted semiconductor on insulator (FDSOI) technology including an SOI substrate including a buried oxide layer, a first semiconductor layer over the buried oxide layer and a second semiconductor layer under the buried oxide layer, a front gate stack formed over the first semiconductor layer, and an insulated contact to the second semiconductor layer, wherein the second semiconductor layer forms the back gate.

13. A static random access memory (SRAM) bitcell circuit, comprising:
a true bitline node;
a complement bitline node;
a first CMOS inverter including a first p-channel transistor and a first n-channel transistor;
a second CMOS inverter including a second p-channel transistor and a second n-channel transistor;
a first direct connection of the complement bitline node to apply a complement bitline potential to a back gate of at least one of the first p-channel transistor and first n-channel transistor; and
a second direct connection of the true bitline node to apply a true bitline potential to a back gate of at least one of the second p-channel transistor and second n-channel transistor.

14. The circuit of claim 13, wherein the first p-channel transistor, first n-channel transistor, second p-channel transistor and second n-channel transistor are implemented in fully-depleted semiconductor on insulator (FDSOI) technology including an SOI substrate including a buried oxide layer, a first semiconductor layer over the buried oxide layer and a second semiconductor layer under the buried oxide layer, a front gate stack formed over the first semiconductor layer, and an insulated contact to the second semiconductor layer, wherein the second semiconductor layer forms the back gate.

15. The circuit of claim 13, wherein the first direct connection directly connects the complement bitline node to the back gates of both the first p-channel transistor and first n-channel transistor; and wherein the second direct connection directly connects the true bitline node to the back gates of both the second p-channel transistor and second n-channel transistor.

16. The circuit of claim 13, further comprising a direct connection of the back gate of the first and second n-channel transistors to a reference voltage supply node.

17. The circuit of claim 13, further comprising: wherein an output of the first CMOS inverter is coupled to a true node; wherein an output of the second CMOS inverter is coupled to a complement node; a wordline node; a first pass transistor coupled between the true bitline node and the true node, the first pass transistor having a gate connected to the wordline node; a second pass transistor coupled between the complement bitline node and the complement node, the second pass transistor having a gate connected to the wordline node; a third direct connection of the wordline node to a back gate of the first pass transistor; and a fourth direct connection of the wordline node to a back gate of the second pass transistor.

18. The circuit of claim 17, wherein the first and second pass transistors are implemented in fully-depleted semiconductor on insulator (FDSOI) technology including an SOI substrate including a buried oxide layer, a first semiconductor layer over the buried oxide layer and a second semiconductor layer under the buried oxide layer, and a front gate stack formed over the first semiconductor layer including an extension of a front gate electrode to contact the second semiconductor layer, wherein the second semiconductor layer forms the back gate.

19. A method for operating a static random access memory (SRAM) bitcell, comprising:
applying a true bitline potential present on a true bitline to a back gate of each of a first p-channel transistor and a first n-channel transistor forming a first CMOS inverter having an input connected to a true node of the SRAM bitcell; and
applying a complement bitline potential present on a complement bitline to a back gate of each of a second p-channel transistor and a second n-channel transistor forming a second CMOS inverter having an input connected to a complement node of the SRAM bitcell.

20. The method of claim 19, further comprising: applying a potential present on a wordline to a back gate of a true pass transistor coupling the true node of the SRAM bitcell to the true bitline; and applying a potential present on the wordline to a back gate of a complement pass transistor coupling the complement node of the SRAM bitcell to the complement bitline.

21. A method for operating a static random access memory (SRAM) bitcell, comprising:
   applying a true bitline potential present on a true bitline to a back gate of at least one of a first p-channel transistor and a first n-channel transistor within a first CMOS inverter having an input connected to a true node of the SRAM bitcell; and
   applying a complement bitline potential present on a complement bitline to a back gate of at least one of a second p-channel transistor and a second n-channel transistor within a second CMOS inverter having an input connected to a complement node of the SRAM bitcell.

22. The method of claim 21, wherein applying the potential present on the true bitline comprises applying the potential present on the true bitline to the back gates of both the first p-channel transistor and first n-channel transistor within the first CMOS inverter; and
   wherein applying the potential present on the complement bitline comprises applying the potential present on the complement bitline to the back gates of both the second n-channel transistor and second p-channel transistor within the second CMOS inverter.

23. The method of claim 21, further comprising applying a reference voltage supply potential to a back gate of the first n-channel transistor within the first CMOS inverter and to a back gate of the second n-channel transistor within the second CMOS inverter.

24. The method of claim 21, further comprising: applying a potential present on a wordline to a back gate of a true pass transistor coupling the true node of the SRAM bitcell to the true bitline; and applying a potential present on the wordline to a back gate of a complement pass transistor coupling the complement node of the SRAM bitcell to the complement bitline.

* * * * *